United States Patent
Park

(10) Patent No.: US 7,402,889 B2
(45) Date of Patent: Jul. 22, 2008

(54) SEMICONDUCTOR DEVICE AND METHOD FOR MANUFACTURING THE SAME

(75) Inventor: Duk-Seo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 395 days.

(21) Appl. No.: 11/264,023

(22) Filed: Nov. 2, 2005

(65) Prior Publication Data

US 2006/0118907 A1    Jun. 8, 2006

(30) Foreign Application Priority Data

Dec. 3, 2004  (KR) .................. 10-2004-0101183

(51) Int. Cl.
*H01L 29/94* (2006.01)

(52) U.S. Cl. ............... 257/532; 438/391; 257/E27.048; 257/E29.346

(58) Field of Classification Search ............... 257/301, 257/302, 303, 532, 381, 386, 387, 389, 391
See application file for complete search history.

(56) References Cited

U.S. PATENT DOCUMENTS

| | | | |
|---|---|---|---|
| 6,534,374 B2 | 3/2003 | Johnson et al. | |
| 6,569,746 B2 | 5/2003 | Lee et al. | |
| 6,597,032 B1 | 7/2003 | Lee | |
| 6,847,077 B2 | 1/2005 | Thomas et al. | |
| 6,897,508 B2 | 5/2005 | Sneh | |
| 6,903,398 B2* | 6/2005 | Yamamoto | 257/295 |
| 7,214,957 B2* | 5/2007 | Ryoo et al. | 257/2 |
| 7,230,292 B2* | 6/2007 | Graettinger | 257/309 |
| 2004/0137693 A1 | 7/2004 | Kim | |

FOREIGN PATENT DOCUMENTS

| | | |
|---|---|---|
| JP | 2003-045967 | 2/2003 |
| KR | 1020030049000 | 6/2003 |
| KR | 1020040059410 | 7/2004 |
| TW | 498528 B | 8/2002 |

* cited by examiner

*Primary Examiner*—W. David Coleman
(74) *Attorney, Agent, or Firm*—Volentine & Whitt, PLLC

(57) ABSTRACT

Disclosed is a metal-insulator-metal (MIM) capacitor structure formed by a metal interconnection process of trench-exposed metal layers formed on stacked interlayer insulating layers. The MIM capacitor uses a conductive layer conformally formed on the metal interconnection and/or trench regions to enlarge constituent electrode surface areas.

34 Claims, 8 Drawing Sheets

SEMICONDUCTOR DEVICE AND METHOD FOR MANUFACTURING THE SAME

BACKGROUND OF THE INVENTION

Embodiments of the present invention relate generally to a metal-insulator-metal (referred to as "MIM" hereinafter) capacitor structure having high capacitance, and an integrated circuit chip including same.

This application claims the benefit of Korean Patent Application 2004-101183 filed on Dec. 3, 2004, the contents of which are hereby incorporated by reference.

Capacitors may be classified accordingly to their junction structure, for example, as metal-oxide-silicon (MOS), p-n junction, polysilicon-insulator-polysilicon (PIP), metal-insulator-metal (MIM), etc. All the above-mentioned examples, except MIM capacitors, comprise at least one electrode material formed from a mono-crystalline silicon or polycrystalline silicon material. However, this use of the mono-crystalline silicon or a polycrystalline silicon limits attempts to reduce the inherent electrical resistance of the constituent electrode. As a result, if a bias voltage is applied to the mono-crystalline silicon or polycrystalline silicon electrode, a depletion region may form, thereby destabilizing the voltage applied to the electrode. When this happens, the capacitance value of the capacitor is not uniformly maintained.

In contrast, the resistance of MIM capacitor electrodes may be additionally reduced, thereby making the capacitor less frequency dependent. Additionally, MIM capacitors have a good capacitance change rate in relation to variations in applied voltage and/or temperature.

As a result of these positive voltage capacitance and/or temperature coefficient characteristics, MIM capacitors are often used in analog products, products receiving mixed signal modes, and products based on system-on-chip (SOC) structures. For example, MIM capacitors are frequently used as an analog capacitor or a filter capacitor in analog or mixed mode signal applications, such as those found in cable/wireless communications. MIM capacitors are also frequently used as a decoupling capacitor on a main process unit board, or an RF capacitor in a high frequency circuit, such as those associated with an embedded DRAM.

FIG. (FIG.) 1 is a cross-sectional view illustrating a semiconductor device having a conventional trench-type MIM capacitor and related interconnections. Referring to FIG. 1, the MIM capacitor comprises a lower electrode 110a, a dielectric layer 130, a conductive layer 140a, and an upper electrode 150a. Also associated with the MIM capacitor structure are related interconnection layers, including lower interconnection 110b and upper interconnection 150b.

Lower electrode 110a and a lower interconnection 110b, typically formed with the same thickness, are formed on a substrate 100. An interlayer insulating layer 120 is then formed on lower electrode 110a and lower interconnection 110b. An opening 125a is formed in interlayer insulating layer 120 to expose a portion of an upper surface of lower electrode 110a. Thereafter, dielectric layer 130 and conductive layer 140a are sequentially formed to predetermine thicknesses within opening 125a on the exposed portion of the upper surface of lower electrode 110a. Upper electrode 150a is then formed on conductive layer 140a. At the same time, upper interconnection 150b is formed on interlayer insulating layer 120.

Prior to the formation of upper interconnection 150b, a contact hole 125b is formed through interlayer insulating layer 120 to expose a portion of lower interconnection 110b.

A contact plug 140b is formed to fill contact hole 125b, such that lower interconnection 110b is electrically connected to upper interconnection 150b.

As can be seen from the illustrated conventional example, only a portion of the upper surface of lower electrode 110a (e.g., a laterally extending conductive surface) is used to form the capacitance structure of the MIM capacitor (i.e., to develop a capacitive charge). As lateral layout space in semiconductor devices comes at an increasing premium, this conventional arrangement suffers from real limits in a designer's ability to increase the overall capacitance of the MIM capacitor. Indeed, as emerging design rules mandate smaller MIM capacitors, the conventional design fails to provide sufficient capacitance.

SUMMARY OF THE INVENTION

Embodiments of the invention recognize the need to improve a MIM capacitor capacitance on the supporting substrate.

In one embodiment, the invention provides a semiconductor device comprising; a first metal pattern formed on a semiconductor substrate, a first interlayer insulating layer formed on the first metal pattern, a second metal pattern formed on the first interlayer insulating layer, a second interlayer insulating layer formed on the second metal pattern, a dielectric layer and conductive layer formed on sidewalls of a first trench formed in the second interlayer insulating layer, the first trench selectively exposing a significant portion of the second metal pattern, and the dielectric layer also being-formed on the significant portion of the second metal pattern and on sidewall portions of a second trench formed in the first interlayer insulating layer, the second trench exposing a significant portion of the first metal pattern, and the dielectric layer also being formed on the significant portion of the first metal pattern, wherein the second trench is formed self-aligned using the second metal pattern as a mask, and a third metal pattern formed on the dielectric layer and conductive layer.

In another embodiment, the invention provides a method for manufacturing a semiconductor device comprising; forming a first metal pattern on a substrate, forming a first interlayer insulating layer on the first metal pattern, forming a second metal pattern on the first interlayer insulating layer, forming a second interlayer insulating layer on the second metal pattern, forming a first trench in the second interlayer insulating layer to expose a significant portion of the second metal pattern, forming a second trench in the first interlayer insulating layer using the second metal pattern as an etch mask to expose a significant portion of the first metal pattern, forming a dielectric layer and a conductive layer on the sidewalls of the first and second interlayer insulating layers formed by the first and second trenches, and on the exposed significant portions of the first and second metal patterns, and forming a third metal pattern on the dielectric layer and the conductive layer.

In yet another embodiment, the invention provides a method for manufacturing a semiconductor device comprising; forming a first metal interconnection and a first metal pattern on a substrate, forming a first interlayer insulating layer on the first metal interconnection and the first metal pattern, forming a second contact plug electrically connected with the first metal interconnection through the first interlayer insulating layer, forming a second metal pattern having a first opening and a second metal interconnection electrically connected with the second contact plug, forming a second interlayer insulating layer, patterning the second interlayer insulating layer to form a first trench exposing the second metal pattern and a third contact hole exposing the second metal interconnection, etching the first interlayer insulating layer exposed by the first opening using the exposed second metal pattern as an etch mask to form a second trench exposing the first metal pattern, forming a conductive layer in the first and second trenches and in the third contact hole, forming a dielectric layer in the first and second trenches; and forming a third metal pattern in the first and second trenches.

In still another embodiment, the invention provides a method for manufacturing a semiconductor device comprising; simultaneously forming a first interconnection and a first metal pattern on a substrate, forming a first interlayer insulating layer on the first metal interconnection and the first metal pattern, simultaneously forming a second metal pattern having a first opening and a second metal interconnection, forming a second interlayer insulating layer on the second metal pattern and the second metal interconnection, patterning the second interlayer insulating layer to form a first trench exposing a significant portion of the second metal pattern and a third contact hole exposing the second metal interconnection, etching a first interlayer insulating layer exposed by the first opening using the exposed second metal pattern as an etch mask to form a second trench exposing the first metal pattern, forming a lower conductive layer conformally in the first and second trenches and filling the third contact hole forming a dielectric layer and a upper conductive layer on the lower conductive layer, and planarizing the upper conductive layer, the dielectric layer and the lower conductive layer until the second interlayer insulating layer is exposed to form a metal-insulator-metal capacitor in the first and the second trench and a third contact plug in the third contact hole.

In still another embodiment, the invention provides a semiconductor device comprising; a first metal pattern formed on a substrate, a first interlayer insulating layer including a second trench exposing the first metal pattern, a second metal pattern disposed on a first interlayer insulating layer around the second trench, a second interlayer insulating layer disposed on the first interlayer insulating layer and the second metal pattern and having a first trench exposing a part of the second metal pattern around the second trench, a dielectric layer and a conductive layer formed on the sidewalls of the first and the second interlayer insulating layer in the first and the second trench and on the first and the second metal pattern, and a third metal pattern formed on the dielectric layer, the conductive layer and the second interlayer insulating layer.

BRIEF DESCRIPTION OF THE DRAWINGS

Attendant features and advantages of the invention will become apparent to those of ordinary skill in the art upon consideration of several exemplary embodiments that follow. These exemplary embodiments are described with reference to the attached drawings. In the drawings, the thickness of certain layers and regions may be exaggerated for clarity. In the drawings, like reference numbers indicate like or similar elements, layers, regions, etc.

DESCRIPTION OF EXEMPLARY EMBODIMENTS

The invention will now be described in some additional detail with reference to the accompanying drawings and in relation to several exemplary embodiments. The invention may, however, be embodied in many different forms beyond the exemplary embodiments, and should not be constructed as being limited to only the illustrated examples. Throughout the description that follows, the term "on" is used to describe a relationship between layers and/or elements in the exemplary embodiments. This term should be construed as covering layers and/or elements directly on one another, as well as layers and/or elements being "on" one another, but possibly having one or more intervening layers and/or elements in between.

FIGS. 2 to 7 are related cross-sectional views illustrating a manufacturing method and a resulting structure for a MIM capacitor in accordance with one embodiment of the invention.

Figure 1:
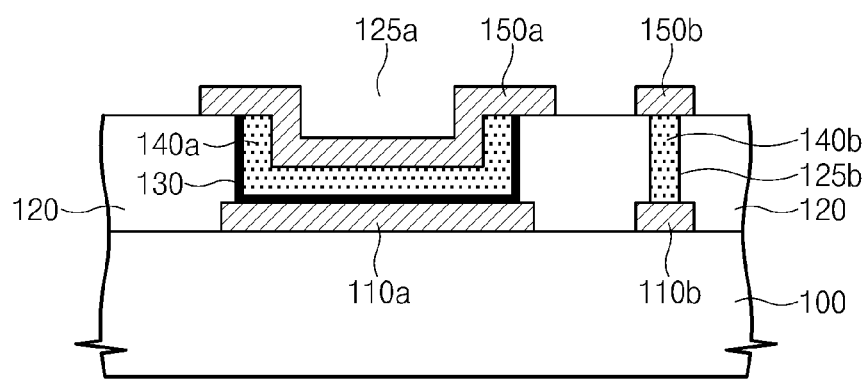
FIG. 1 is a cross-sectional view of a conventional metal-insulator-metal capacitor.
Figure 2:
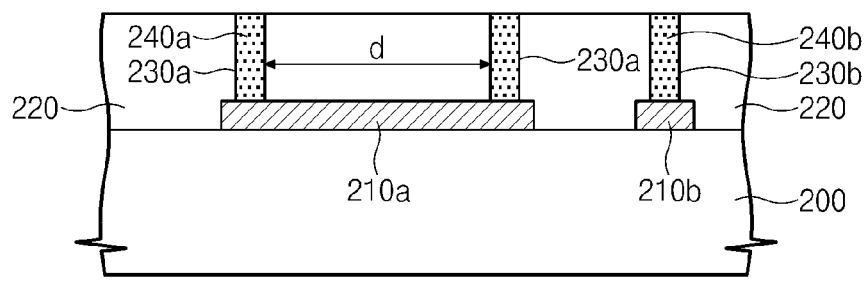
FIGS. 2 to 7 are cross-sectional views illustrating a manufacturing method and a structure for embodying a MIM capacitor in accordance with the first embodiment of the present invention.

Referring to FIG. 2, a first metal pattern 210a and a first metal interconnection 210b are formed on a semiconductor substrate 200. The semiconductor substrate 200 may have a transistor structure, an interconnection layer and an interlayer insulating layer. First metal pattern 210a is used as a first lower electrode of a MIM capacitor.

Although not specifically shown in FIG. 2, first metal pattern 210a may be connected with one or more interconnections, such as those commonly used to provide an external voltage to the MIM capacitor, e.g., a laterally connected conductive pattern, a contact plug rising to contact a lower surface of the first metal pattern 210a, etc.

Following the formation of first metal pattern 210a and first metal interconnection 210b, a first interlayer insulating layer 220 is continuously formed on the resulting structure. In one related embodiment, first interlayer-insulating layer 220 is formed to a thickness of between 2000 and 10,000 Å from a material having a relatively low dielectric constant in order to control parasitic capacitance associated with the semiconductor device. First interlayer insulating layer 220 may be formed, for example, from a silicon oxide material such as medium temperature oxide MTO, tetraethylorthosilicate TEOS, boro-phosphor silicate glass BPSG, undoped silicate glass USG or fluoro silicate glass FSG, or silicon nitride $Si_xN_y$.

Next, a conventional photoresist pattern is selectively used to expose portions of first interlayer insulating layer 220 in relation to the anticipated location of the lower electrode and associated metal interconnection of the MIM capacitor. For example, first interlayer insulating layer 220, as exposed by the photoresist pattern, may be etched to form first contact holes 230a and a second contact hole 230b through first interlayer insulating layer 220 to expose a portion of first metal pattern 210a and first metal interconnection 210b.

First contact holes 230a may be formed to expose respective and opposite "outermost portions" on first metal pattern 210a. The separation distance "d" between first contact holes 230a defines in large measure the capacitance characteristics of lower electrodes of the MIM capacitor. It is generally preferable that first contact holes 230a are formed in such a manner that separation distance "d" is practically maximized.

Subsequently, first contact holes 230a and the second contact hole 230b are filled with a conductive material to form first contact plugs 240a and a second contact plug 240b. The conductive material may be formed by depositing tungsten, aluminum, copper, or some other metal or metal alloy using conventional techniques. In one embodiment, the conductive layer is preferably formed from tungsten. Although not shown in FIG. 2, a barrier layer may be formed before the conductive material is formed to fill first contact holes 230a and second contact hole 230b. The barrier layer may be formed by depositing a titanium Ti layer and/or a titanium nitride TiN layer.

Figure 3A:
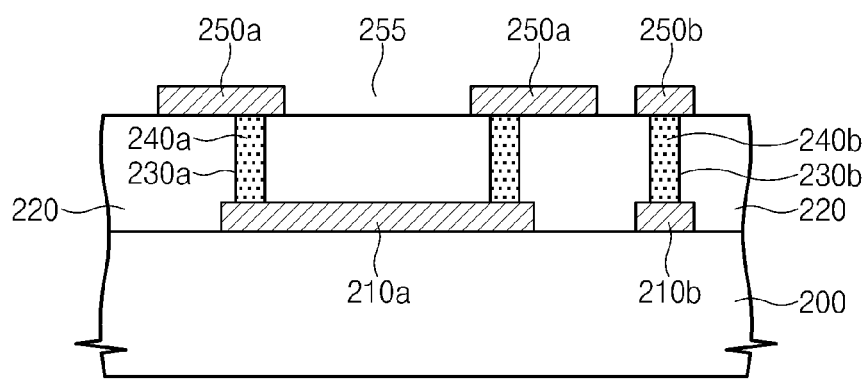

Next, as shown in FIG. 3A, a second metal pattern 250a and a second metal interconnection 250b are formed on first interlayer insulating layer 220. Second metal pattern 250a is formed in electrical contact with first contact plugs 240a, and second metal interconnection 250b is formed in electrical contact with second contact plug 240b. Therefore, second metal interconnection 250a is electrically connected with first metal pattern 210a by first contact plugs 240a. Likewise, second metal interconnection 250b is electrically connected with first metal interconnection 210b by second contact plug 240b. Second metal pattern 250a is defined in relation to a centrally located first opening 255. The size and geometry of first opening 255 determine a geometry and size of first metal pattern 210a contacting the dielectric layer to be formed. Accordingly, it is generally preferable that first opening 255 be formed as large as reasonably possible up to a limit in which the respective first contact plugs 240a remain covered by interlayer insulating layer 220.

This design consideration further emphasizes the desirability of forming first contact holes 230a at the outermost portions of first metal pattern 210a, thereby maximizing lateral separation distance "d".

However, second metal pattern 250a is formed such that at least some portion of it overlaps an outer sidewall portion of first metal pattern 210a. Further, first contact plugs 240a are formed near this overlapping portion.

Figure 3B:
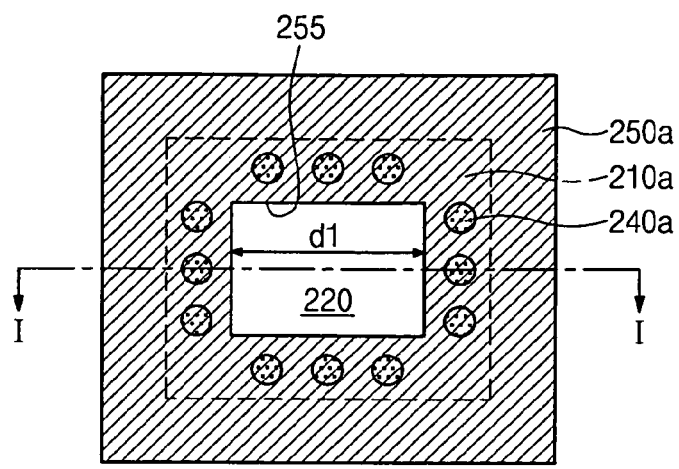
Figure 3C:
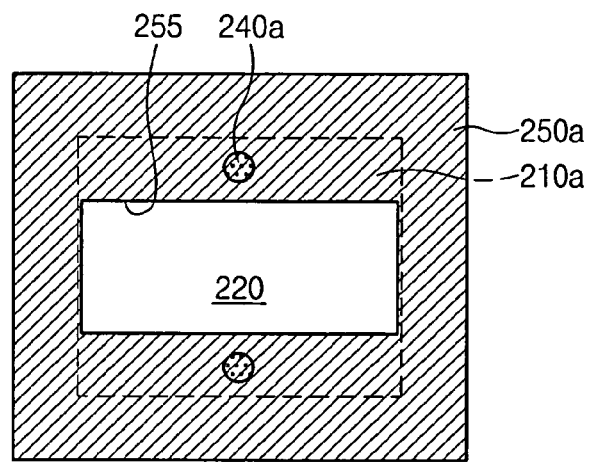
Figure 3D:
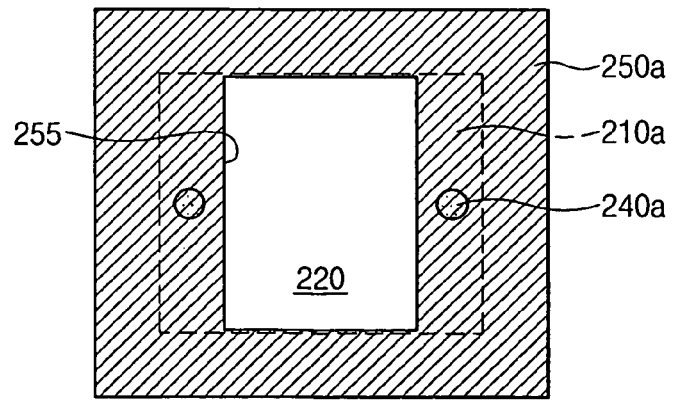

FIGS. 3B, 3C, and 3D are exemplary and alternative plan views of the cross-sectional view shown in FIG. 3A. As illustrated in these figures, second metal pattern 250a is formed with a peripheral belt-shape region overlapping an outer boundary edge of first metal pattern 210a. The combination of first metal pattern 210a and second metal pattern 250a may be used to form the lower electrode of a MIM capacitor in accordance with one embodiment of the invention.

The first contact plugs 240a formed through first interlayer insulating layer 220 to connect first metal pattern 210a with second metal pattern 250a may be formed within belt-shaped overlapping regions of second metal pattern 250a. In one embodiment, it is preferred that the region of first metal pattern 210a overlapped by the overlapping region of second metal pattern 250a outside the respective first contact plugs 240a be as small as possible, yet sufficient to allow stable formation of first contact plugs 240a.

Any reasonable number of first contact-plugs 240a may be used to electrically connect first metal pattern 210a with second metal pattern 250a. However, in one embodiment, it is preferred that first contact plugs 240a be symmetrically formed around or across the center of first opening 225. For example, twelve (12) first contact plugs 240a are formed around edge of first opening 225 in FIG. 3B. However, as shown in FIGS. 3C and 3D, only two (2) first contact plugs 240a may be formed on opposing sides of first opening 225.

However, the provision of relatively fewer first contact plugs 240a allows the size of first opening 225 to be expanded accordingly.

Additionally, at least some portion of second metal interconnection 250b is form on (e.g., overlapping) first metal interconnection 210b. Second contact plug 240b electrically connects first metal interconnection 210b with second metal interconnection 250b through first interlayer insulating layer 220.

Figure 4:
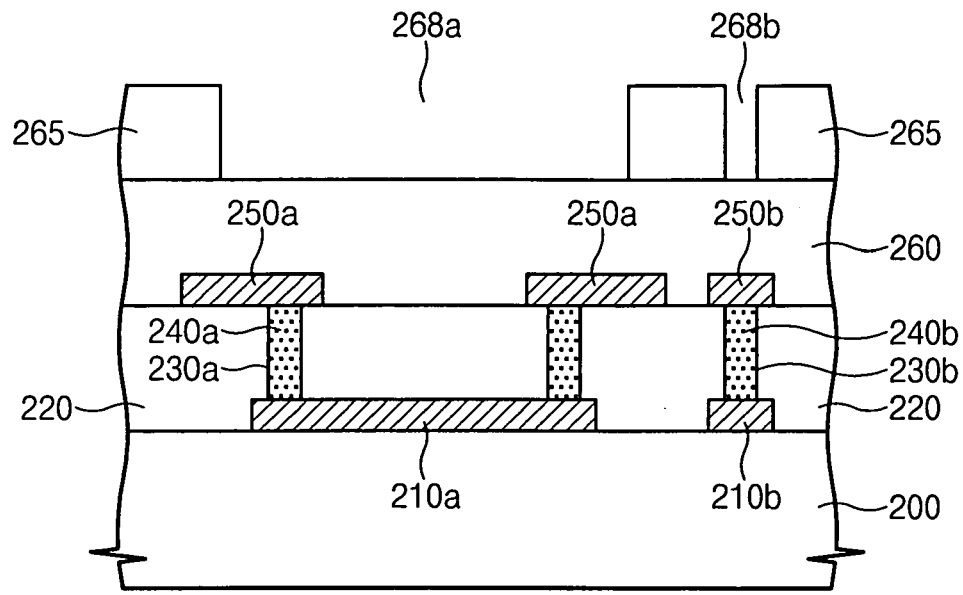

As shown in FIG. 4, a second interlayer insulating layer 260 is formed on second metal pattern 250a, second metal interconnection 250b and exposed upper surface portions of first interlayer insulating layer 220. A photoresist pattern 265, defining a second opening 268a and a third opening 268b to be selectively formed through second interlayer insulating layer 260 in relation to the locations of the MIM capacitor and a metal interconnection, is then formed on second interlayer layer 260. The size of second opening 268a, as defined by photoresist pattern 265, is larger than that of first opening 255, as defined by second metal pattern 250a. In one embodiment, it is preferred that second opening 268a be formed sufficiently large to expose at least some significant portion of the upper surface of second metal interconnection 250a. As will be seen hereafter, the size of the exposed portions of second metal pattern 250a, as defined by second opening 268a, is directly related to the capacitance of the MIM capacity.

Figure 5:
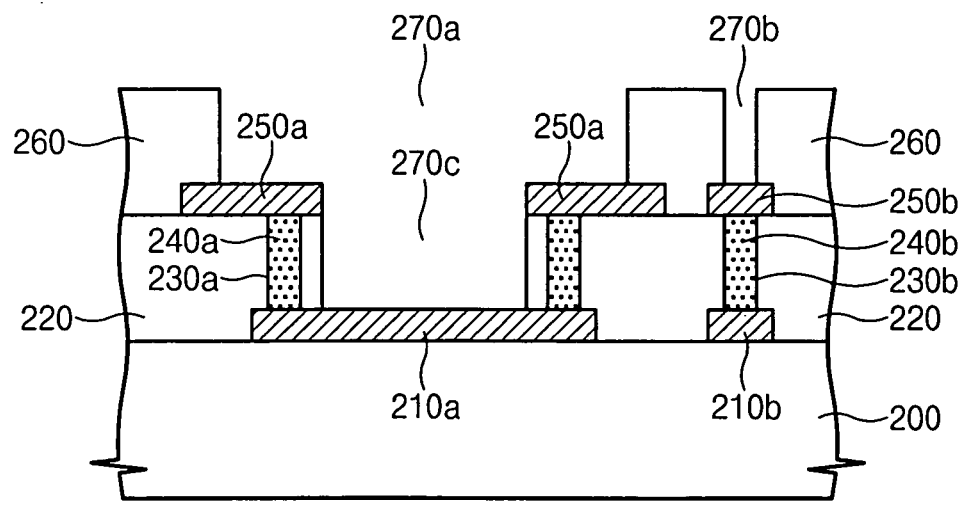

As shown in FIG. 5, portions of second interlayer insulating layer 260 exposed through photoresist pattern 265 are etched to form a first trench 270a exposing the significant portion of second metal pattern 250a, and a third contact hole 270b exposing a portion of second metal interconnection 250b.

Subsequently, first interlayer insulating layer 220 is etched using second metal pattern 250a as an etch mask to form a second trench 270c within first trench 207a exposing a portion of the upper surface of first metal pattern 210a. Second trench 270c is formed through first interlayer insulating layer 220 between first contact plugs 240a, as formed on first metal pattern 210a. Thus, in one embodiment to the invention, the use of a mask employed in a general metal interconnection process makes it possible to form first trench 270a and second trench 270c which define a capacitor electrode without the need for additional masks. This significantly simplifies the overall manufacturing process. In particular, second metal pattern 250a and the second metal interconnection 250b are used as an etch mask during an etch process applied to first interlayer insulting layer 220 in order to form second trench 270c.

Portions of first and second metal pattern 210a and 250a exposed by the above-described photolithography process are used to form a lower electrode of the MIM capacitor in one embodiment of the invention. Accordingly, in one embodiment of the invention it is preferable that first and second trenches 270a and 270c be formed to expose as large a surface area as possible on first and second metal patterns 210a and 250a in order to maximize electrode size and the corresponding capacitor capacitance.

Figure 6:
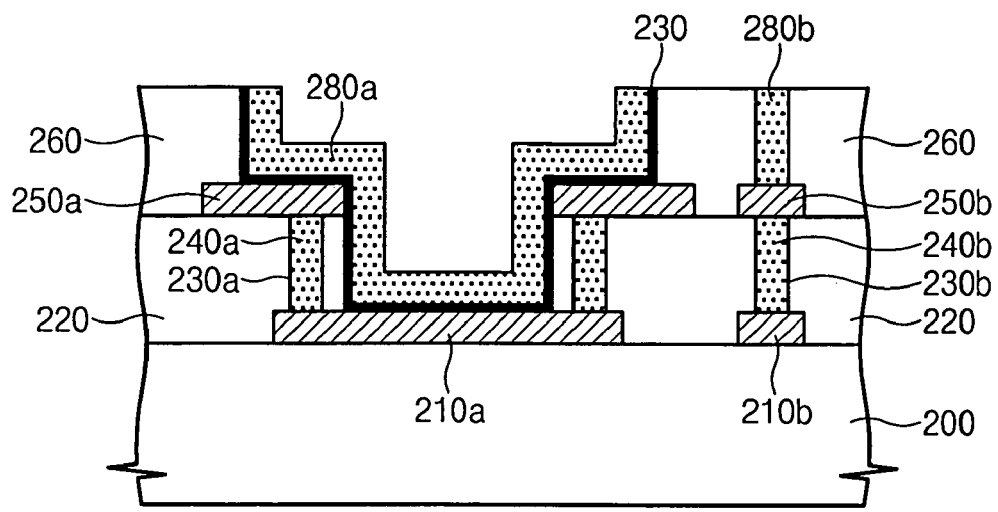

Thereafter, as shown in FIG. 6, a capacitor dielectric layer 230 and a conductive layer 280a are conformally formed on the sidewall and lateral surfaces defined by first and second trenches 270a and 270c. Also at this time, a conductive layer or a third contact plug 280b is formed in third contact hole 270b to electrically connect-second metal interconnection 250b with third metal interconnection 290b, as it is formed by subsequent processes.

The capacitor dielectric layer 230 may be formed from an oxide layer, a nitride layer, or a composite layer of an oxide and/or nitride layer(s). Alternatively, a high k-dielectric material having improved capacitance characteristics may be used to form dielectric layer 230. For example, one or more widely available, conventional high k-dielectric material(s) might be used, such as $Al_xO_y$, $Hf_xO_y$, $Ta_xO_y$, etc. Depending on the actual material(s) used, dielectric layer 230 will be formed to a proper thickness in accordance with the required capacitance.

Conductive layer 280a and third contact plug 280b may be formed from similar metal and/or metal alloys (e.g., tungsten, aluminum and/or copper) as were used to form first and second contact plugs 240a and 240b. As before noted, in at least one embodiment, tungsten is the preferred material. The previously noted and optionally provided barrier layer(s) (e.g., a titanium Ti layer and/or titanium nitride TiN layer) may be used in the formation of conductive layer 280a and third contact plug 280b.

As shown in FIG. 6, selected portions of dielectric layer 230, conductive layer 280a and third contact plug 280b remain in first and second trenches 270a and 270c, as well as third contact hole 270b, once undesired portions of these material layers are removed from the resulting structure using a conventional planarization process. For example, dielectric layer 230 and conductive layer 280a may be simultaneously patterned by a photolithography process used to form a third metal pattern and third metal interconnection as subsequently formed.

Figure 7:
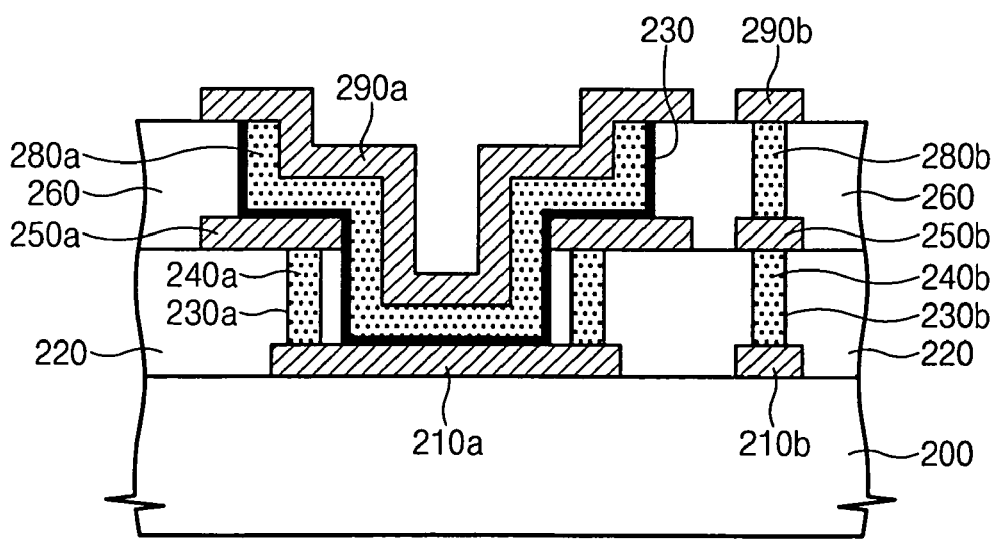

As shown in FIG. 7, a third metal pattern 290a and a third metal interconnection 290b are sequentially formed on conductive layer 280a, as it is formed in first and second trenches 270a and 270c, and on second interlayer insulating layer 260. Thus, in one embodiment of the invention, third metal pattern 290a is stacked on conductive layer 280a in first and second trenches 270a and 270c, and functions as an upper electrode of the MIM capacitor. A third metal interconnection 290b is also formed in electrical contact with third contact plug 280b, as well as first and the second metal interconnection 210b and 240b.

In one embodiment, third metal pattern 290a is conformally formed on the geometric profile defined by the shapes of first and the second trenches 270a and 270c. In another embodiment, third metal pattern 290a fill all or a significant portion of first and/or second trenches 270a and 270b.

A third interlayer insulating layer (not shown in FIG. 7) may be additionally stacked on an entire surface of the resulting structure (i.e., on the upper electrode structure and associated metal interconnections). A contact hole may then be formed through the third interlayer insulating layer to expose a portion of the upper electrode structure. This contact hole may then be filled with conductive material to form a contact plug connecting an upper interconnection (not shown) to thereby complete the structure of the MIM capacitor.

The foregoing method and sequence of steps used to form the exemplary MIM capacitor are subject to alteration and modification. For example, the order of dielectric layer and conductive layer formation might be easily reversed.

Figure 8A:
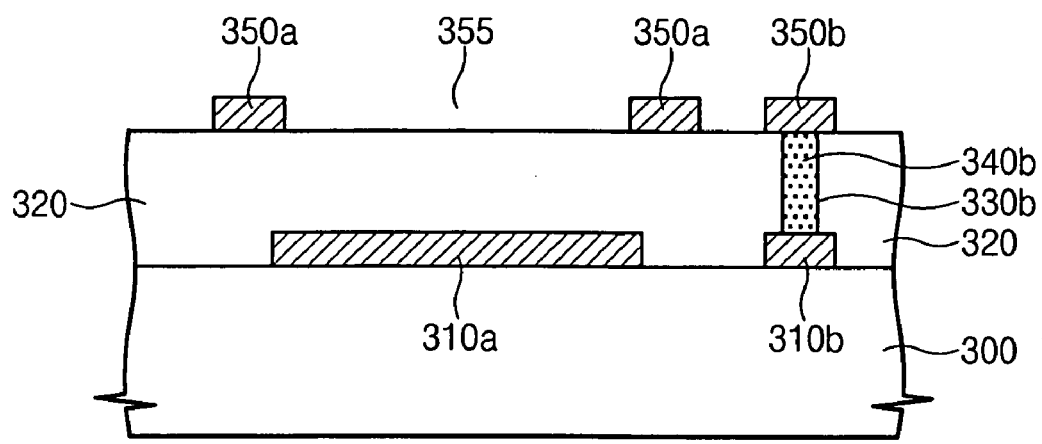
FIGS. 8 to 11 are cross-sectional views illustrating a manufacturing method and a structure for embodying a MIM capacitor in accordance with the second embodiment of the present invention.

FIGS. 8A to 11 are cross-sectional views illustrating a manufacturing method and a structure for a MIM capacitor in accordance with another embodiment of the present invention. Three hundred (300) series numbered elements in FIGS. 8A and 8B are analogous to corresponding two hundred (200) series number elements related to the former principal embodiment illustrated in FIGS. 2, 3A and 3B.

Figure 8B:
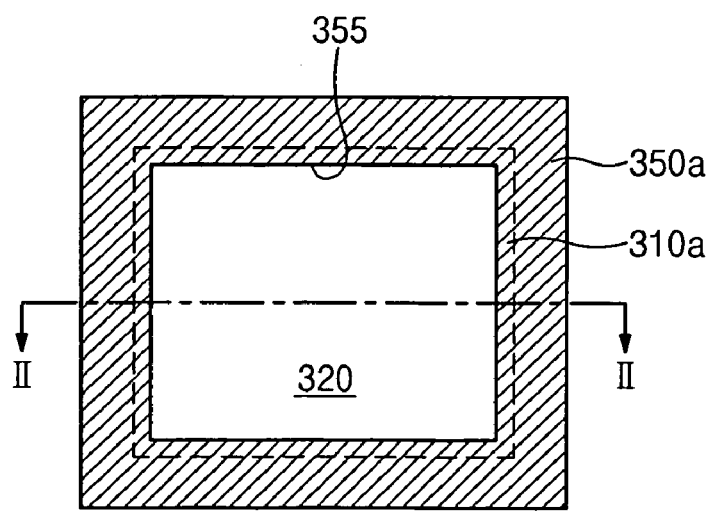
Figure 9:
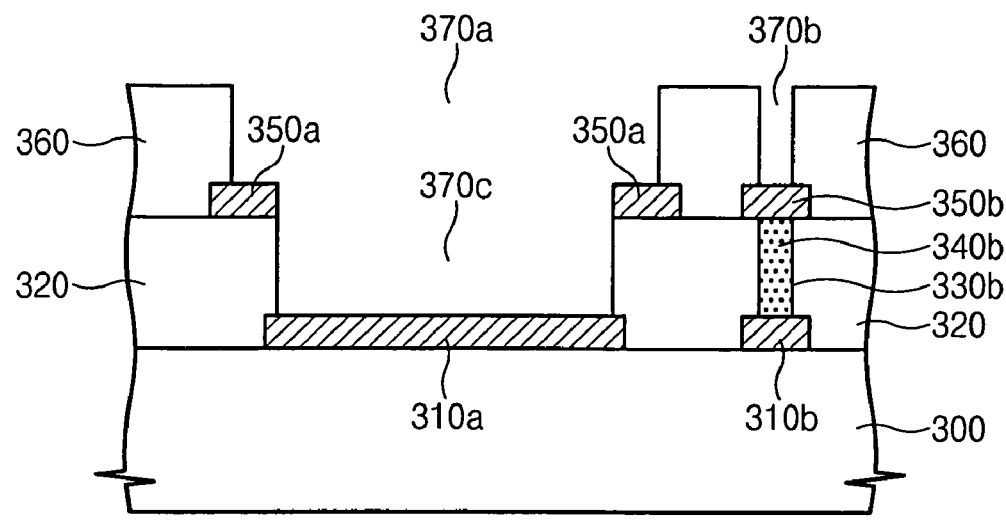

Referring to FIGS. 8A and 8B, second metal pattern 350a and second metal interconnection 350b are formed on first interlayer insulating layer 320 covering on first metal pattern 310a and first metal interconnection 310b formed on semiconductor substrate 300. However, in a conceptual departure from the first embodiment, first contact holes exposing first metal pattern 310a are not formed through first interlayer insulating layer 320. Instead, only second contact hole 330b exposing first metal interconnection 310b is formed through first interlayer insulating layer 320.

A conductive material is formed (e.g., deposited) to fill second contact hole 330b forming a contact plug 340b. Here again, the conductive material may comprise tungsten, aluminum, and/or copper, etc., and in one embodiment tungsten preferably.

Second metal pattern 350a is then formed so that at least a portion overlaps and extends outwardly beyond the periphery of first metal pattern 310a. In one embodiment, as shown in FIG. 8B, second metal pattern 350a is preferably formed as a belt-shaped region circumferentially overlapping the outer edge of first metal pattern 310a.

Unlike the first principal embodiment, contact holes electrically connecting first metal pattern 310a with second metal pattern 350a are not formed on first interlayer insulating layer 320 in the overlapping region of second metal pattern 350a. Accordingly, the region wherein first metal pattern 310a is overlapped by second metal pattern 350a may be minimized, thereby maximizing the capacitor's capacitance.

Second metal interconnection 350b such that it overlaps at least a portion of first metal interconnection 310b, and second contact plug 340b electrically connects first metal interconnection 310b with second metal interconnection 350b through first interlayer insulating layer 320.

The fabrication process for the MIM capacitor of this second principal embodiment as described above proceeds to the illustrated in FIG. 9. That is, second interlayer insulating layer 360 is formed-on second metal pattern 350a, second metal interconnection 350b and first interlayer insulating layer 320. Second interlayer insulating layer 360 is etched in relation to the location of the constituent MIM capacitor components. A first trench 370a exposing some significant portion of second metal pattern 350a, and a third contact hole 370b exposing a portion of second metal interconnection 350b are also formed.

Next, first interlayer insulating layer 320 is etched using second metal pattern 350a as an etch mask to form second trench 370c exposing first metal pattern 310a.

Figure 10:
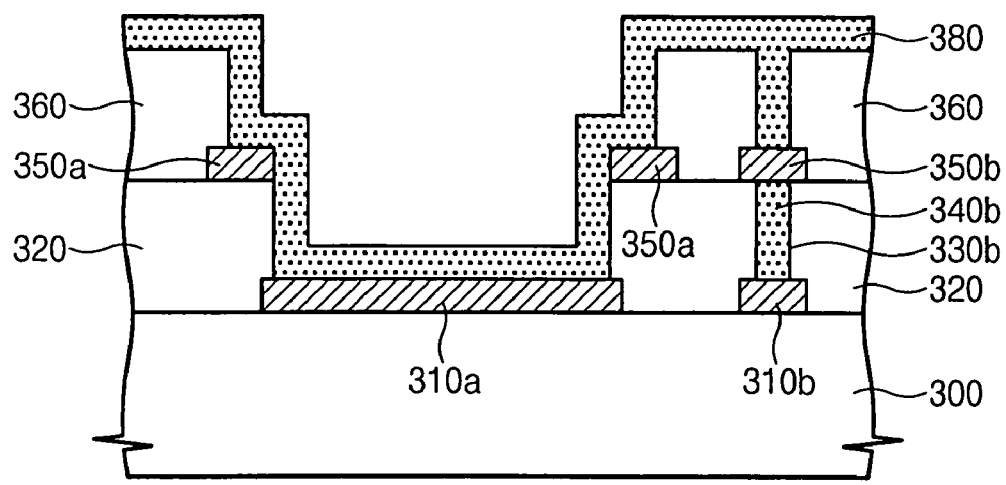

Next, as shown in FIG. 10, a conductive layer 380 is conformally formed on the upper portion of second interlayer insulating layer 360 and within the first and second trenches 370a and 370c. At this time, conductive layer 380 may also be formed to fill third contact hole 370b, thereby electrically connecting second metal interconnection 350b with the third metal interconnection 390b yet to be formed.

Here again, one or more materials such as tungsten, aluminum, or copper may be deposited to form conductive layer 380. The same material type may be used to form second contact plug 340b. A suitable barrier layer may also be optionally used in this embodiment.

Figure 11:
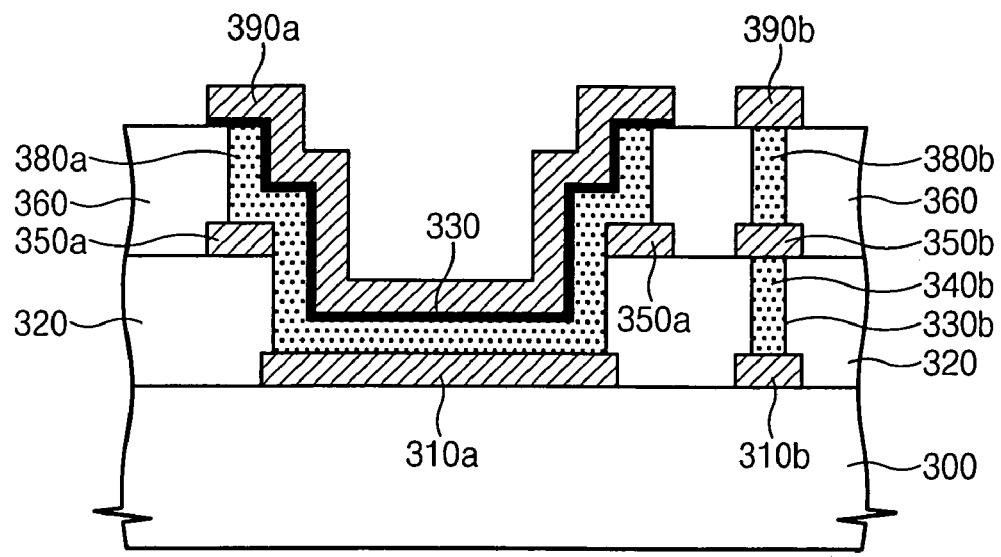

Subsequently, as shown in FIG. 11, conductive layer 380 covering the upper surface of second interlayer insulating layer 360 is removed by a conventional planarization process to form conductive layer pattern 380a to be used as the lower electrode in the trenches, and to form a third contact plug 380B in the third contact hole 370b.

As conductive layer 380 is stacked before a dielectric layer is formed unlike the first embodiment where a conductive layer is stacked after a dielectric layer is formed, conductive layer pattern 380a electrically connects first metal pattern 310a with second metal pattern 350a and simultaneously becomes the lower electrode of a MIM capacitor in accordance with present embodiment. Accordingly, as the sidewalls of first and second trenches 370a and 370c are used as an effective capacitor electrode formation areas, the resulting capacitance of the MIM capacitor capacity may be increased or maximized in largely the same lateral surface area of the substrate occupied by the conventional MIM capacitor.

As before, third contact plug 380b electrically connects second metal interconnection 350b with third metal interconnection 390b. A capacitor dielectric layer 330 may be continuously formed on conductive layer pattern 380a in first and second trenches 370a and 370c. Capacitor dielectric layer 330 may be formed from an oxide, a nitride, or a composite structure including both an oxide and a nitride. In addition, a high-k dielectric material suitable for improving a capacitance may be used as dielectric layer 330.

Next, third metal pattern 390a and third metal interconnection 390b are formed in first and second trenches 370a and 370c and on the upper surface of second interlayer insulating layer 360. Third metal pattern 390a is stacked on dielectric layer 330 in the first and second trenches 370a and 370c to form an upper electrode of the MIM capacitor. Third metal interconnection 390b is stacked on third contact plug 380b to be electrically connected with the first and second metal interconnections 310b and 340b.

Third metal pattern 390a may be conformally formed on the first and second trenches 370a and 370c, or may be formed to fill the trenches completely. As is conventionally understood, a third interlayer insulating layer may be additionally formed on the resulting structure, and a contact hole may be formed through the third interlayer insulating layer to expose a portion of the upper electrode. This contact hole may then be filled with a conductive layer to form a contact plug connecting an upper interconnection with the MIM capacitor.

Figure 12:
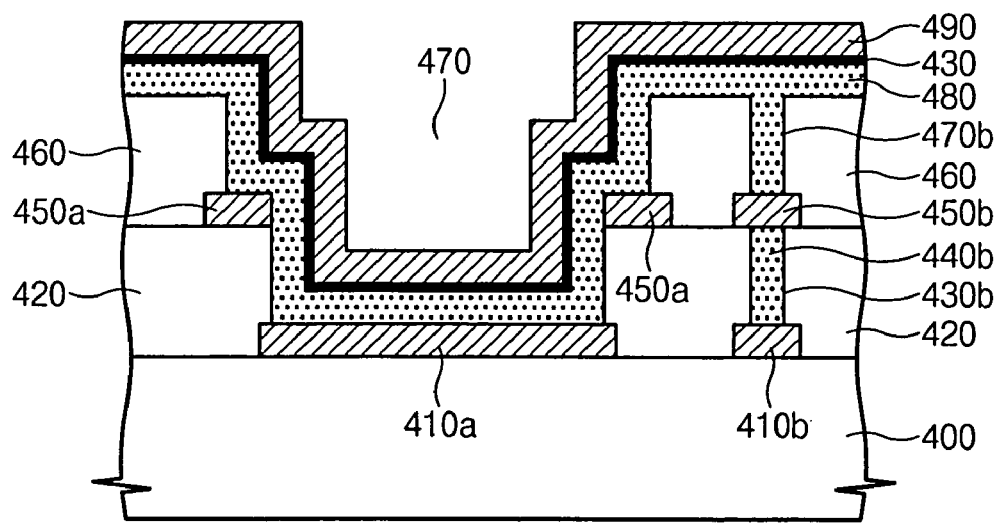
FIGS. 12 to 14 are cross-sectional views illustrating a manufacturing method and a structure for embodying a MIM capacitor in accordance with the third embodiment of the present invention.
Figure 13:
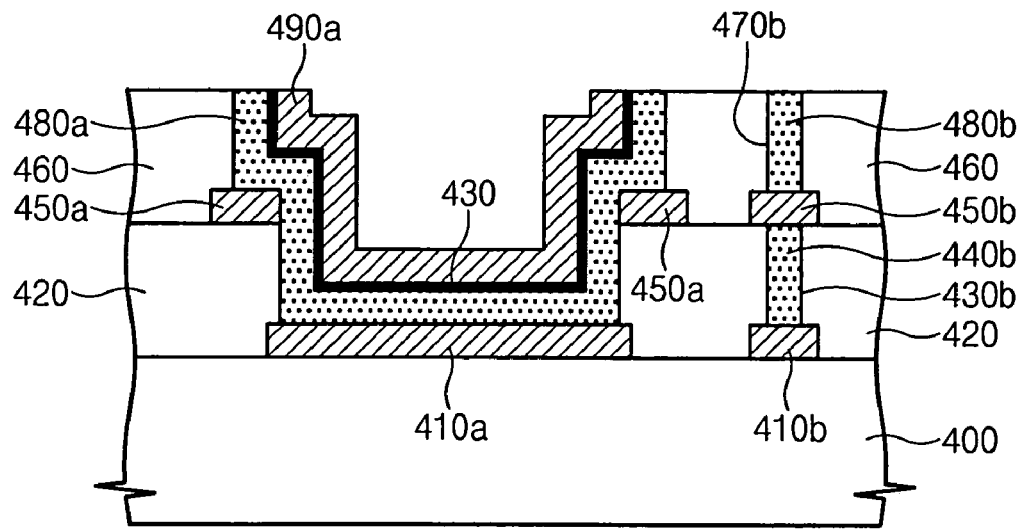
Figure 14:
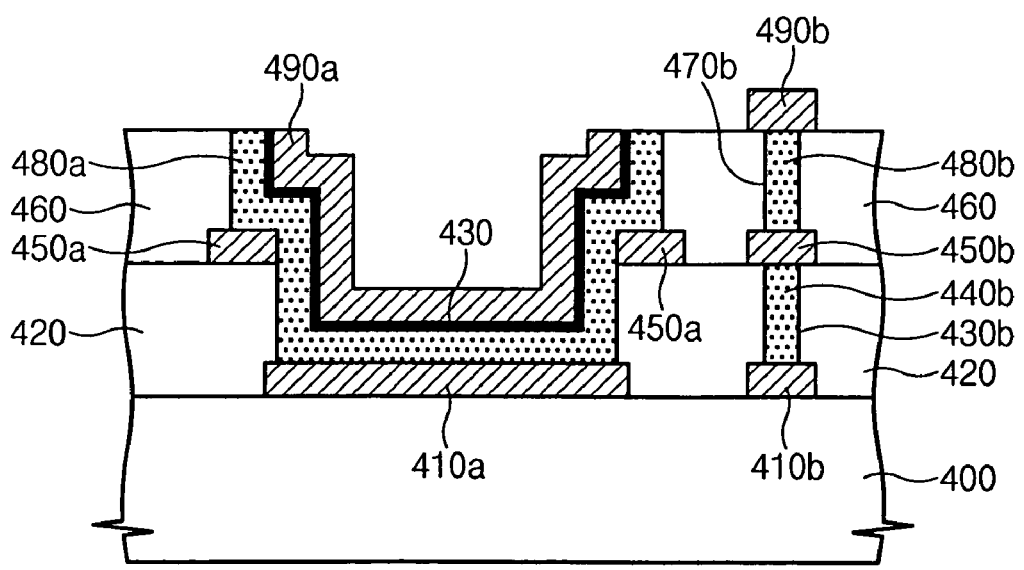

FIGS. 12 to 14 are cross-sectional views schematically illustrating a MIM capacitor in accordance with another embodiment of the invention. Unlike the previously illustrated exemplary methods for forming a MIM capacitor described in relation to FIGS. 8A to 11, a lower electrode, a dielectric layer and an upper electrode are electrically separated from the neighboring capacitor by one planarization process. Referring to FIG. 12, after the same process is performed by the same method described with reference to FIGS. 8A to 11, a dielectric layer 430 and a conductive layer 490 forming an upper electrode are formed on a conductive layer 480 for a lower electrode.

Next, referring to FIG. 13, a planarization process such as a chemical mechanical (CMP) vapor deposition method may be carried out with respect to the stacked layers 480, 430 and 490 until the interlayer insulating layer 460 is exposed to form a MIM capacitor defined in trench 470. At this time, selected portions of a conductive layer remain in third contact hole 470b to form a third contact plug 480b. Here, before performing a planarization process, a sacrificial insulating layer may be further provided to fill the trench as a selective membrane so that the membrane filling trench 470 prevents damage to the resulting structure during the planarization process.

Next, referring to FIG. 14, a conductive layer is deposited and patterned to form a third metal interconnection 490b which is electrically connected with third contact plug 480b.

While several exemplary embodiments of the invention have been described in detail, the invention should not be construed as being limited to only the illustrated embodiments. It should be readily apparent to those skilled in the art in view of the foregoing description that the thickness, size and material composition of the various layers and elements forming the MIM capacitor may be forming (e.g., deposited, etched, patterned, protected, etc) using a number of applicable techniques and fabrication systems.

In accordance with the foregoing embodiments of a MIM capacitor, a trench is formed using a metal interconnection layer formed on a different layer. A conductive layer may then be conformally formed on a metal interconnection layer formed on the different layer, as exposed by the trench region in order to form a lower electrode. In this manner, the effective surface area of the lower electrode is increased and thereby, the capacitance of the resulting MIM capacitor increased. In addition, the trenches penetrating the different interlayer insulating layer are patterned using a metal interconnection layer as an etch mask, thereby reducing the number of process steps required to form the MIM capacitor.

What is claimed is:

1. A semiconductor device comprising:
a first metal pattern formed on a semiconductor substrate;
a first interlayer insulating layer formed on the first metal pattern;
a second metal pattern formed on the first interlayer insulating layer;
a second interlayer insulating layer formed on the second metal pattern;
a dielectric layer and conductive layer formed on sidewalls of a first trench formed in the second interlayer insulating layer, the first trench selectively exposing a significant portion of the second metal pattern, and the dielectric layer also being formed on the significant portion of the second metal pattern and on sidewall portions of a second trench formed in the first interlayer insulating layer, the second trench exposing a significant portion of the first metal pattern, and the dielectric layer also being formed on the significant portion of the first metal pattern;
wherein the second trench is formed self-aligned using the second metal pattern as a mask;.and
a third metal pattern formed on the dielectric layer and conductive layer.

2. The device of claim 1, wherein the conductive layer is sequentially formed on the dielectric layer.

3. The device of claim 1, wherein the conductive layer comprises tungsten or a tungsten alloy.

4. The device of claim 1, further comprising:
a first metal interconnection formed on the substrate; and
a second metal interconnection formed in the first interlayer insulating layer.

5. The device of claim 1, further comprising:
a third metal interconnection formed on the second interlayer insulating layer.

6. The device of claim 1, wherein the first, second, and third metal patterns are formed from a material comprising aluminum.

7. The device of claim 2, wherein at least portions of the first and second metal patterns collectively comprise a capacitor lower electrode.

8. The device of claim 7, further comprising:
at least one first contact plug electrically connecting the first and second metal patterns.

9. The device of claim 8, wherein at least one first contact plug is formed through the first interlayer insulating layer outside the first trench.

10. The device of claim 1, wherein the dielectric layer is sequentially formed on the conductive layer.

11. The device of claim 10, wherein at least portions of the first and second metal patterns and conductive layer collectively form a capacitor lower electrode.

12. The device of claim 4, further comprising:
a second contact plug electrically connecting the first and second metal interconnections through the first interlayer insulating layer.

13. The device of claim 5, further comprising:
a third contact plug electrically connecting the second and third metal interconnections through the second interlayer insulating layer.

14. The device of claim 5, wherein the first, second, and third metal interconnections are formed from a material comprising aluminum.

15. The device of claim 13, wherein the third contact plug is formed of the same material as the conductive layer.

16. A method for manufacturing a semiconductor device comprising:
forming a first metal pattern on a substrate;
forming a first interlayer insulating layer on the first metal pattern;
forming a second metal pattern on the first interlayer insulating layer;
forming a second interlayer insulating layer on the second metal pattern;
forming a first trench in the second interlayer insulating layer to expose a significant portion of the second metal pattern;
forming a second trench in the first interlayer insulating layer using the second metal pattern as an etch mask to expose a significant portion of the first metal pattern;
forming a dielectric layer and a conductive layer on the sidewalls of the first and second interlayer insulating layers formed by the first and second trenches, and on the exposed significant portions of the first and second metal patterns; and
forming a third metal pattern on the dielectric layer and the conductive layer.

17. The method of claim 16, wherein the dielectric layer and the conductive layer are conformally formed on the sidewalls of the first and second interlayer insulating layers and on the exposed significant portions of the first and second metal patterns.

18. The method of claim 16, wherein the dielectric layer is sequentially formed on the conductive layer.

19. The method of claim 16, further comprising:
forming a first metal interconnection with the first metal pattern; and,
forming a second metal interconnection with the second metal pattern.

20. The method of claim 16, further comprising:
forming a second contact plug electrically connecting the first and second metal interconnections through the first interlayer insulating layer.

21. The method of claim 16, further comprising:
forming a third metal interconnection on the second interlayer insulating layer.

22. The method of claim 17, wherein the conductive layer is sequentially formed on the dielectric layer.

23. The method of claim 22, wherein at least portions of the first and second metal patterns collectively comprise a capacitor lower electrode.

24. The method of claim 23, further comprising:
forming at least one first contact plug electrically connecting the first and second metal patterns through the first interlayer insulating layer.

25. The method of claim 18, wherein the conductive layer forms a capacitor lower electrode.

26. The method of claim 21, further comprising:
forming a third contact plug electrically connecting the second and third metal interconnections through the second interlayer insulating layer.

27. The method of claim 26, wherein the third contact plug is formed of the same material as the conductive layer.

28. A method for manufacturing a semiconductor device comprising:
forming a first metal interconnection and a first metal pattern on a substrate;
forming a first interlayer insulating layer on the first metal interconnection and the first metal pattern;
forming a second contact plug electrically connected with the first metal interconnection through the first interlayer insulating layer;
forming a second metal pattern having a first opening and a second metal interconnection electrically connected with the second contact plug;
forming a second interlayer insulating layer;
patterning the second interlayer insulating layer to form a first trench exposing the second metal pattern and a third contact hole exposing the second metal interconnection;
etching the first interlayer insulating layer exposed by the first opening using the exposed second metal pattern as an etch mask to form a second trench exposing the first metal pattern;
forming a conductive layer in the first and second trenches and in the third contact hole;
forming a dielectric layer in the first and second trenches;
forming a third metal pattern in the first and second trenches.

29. The method of claim 28, wherein forming the dielectric layer and the conductive layer pattern comprises:
forming the dielectric layer in the first and the second trench;
forming a conductive layer on the dielectric layer such that it fills the third contact hole; and
performing a planarization process to remove any portion of the conductive layer outside the first and second trenches, and outside the third contact hole.

30. The method of claim 28, wherein forming the dielectric layer and the conductive layer pattern comprises:
forming a conductive layer on the first and second trenches and filling the third contact hole;
performing a planarization process to remove any portion of the conductive layer outside the first and second trenches and outside the third contact hole to form a conductive layer pattern and a third contact plug; and
forming the dielectric layer on the conductive layer pattern.

31. The method of claim 28, further comprising:
forming a first contact plug electrically connecting the first and second metal patterns through the first interlayer insulating layer outside the second trench.

32. The method of claim 28, wherein forming the first trench and the third contact hole comprises:
forming a photoresist pattern having a second opening larger than the first opening and a third opening with substantially the same size as the third contact hole on the second interlayer insulating layer; and
etching the second interlayer insulating layer exposed by the second opening and the third opening.

33. A method for manufacturing a semiconductor device comprising:
simultaneously forming a first interconnection and a first metal pattern on a substrate;
forming a first interlayer insulating layer on the first metal interconnection and the first metal pattern;

simultaneously forming a second metal pattern having a first opening and a second metal interconnection;

forming a second interlayer insulating layer on the second metal pattern and the second metal interconnection;

patterning the second interlayer insulating layer to form a first trench exposing a significant portion of the second metal pattern and a third contact hole exposing the second metal interconnection;

etching a first interlayer insulating layer exposed by the first opening using the exposed second metal pattern as an etch mask to form a second trench exposing the first metal pattern;

forming a lower conductive layer conformally in the first and second trenches and filling the third contact hole;

forming a dielectric layer and an upper conductive layer on the lower conductive layer; and planarizing the upper conductive layer, the dielectric layer and the lower conductive layer until the second interlayer insulating layer is exposed to form a metal-insulator-metal capacitor in the first and the second trench and a third contact plug in the third contact hole.

34. A semiconductor device comprising:

a first metal pattern formed on a substrate;

a first interlayer insulating layer including a second trench exposing the first metal pattern;

a second metal pattern disposed on a first interlayer insulating layer around the second trench;

a second interlayer insulating layer disposed on the first interlayer insulating layer and the second metal pattern and having a first trench exposing a part of the second metal pattern around the second trench;

a dielectric layer and a conductive layer formed on the sidewalls of the first and the second interlayer insulating layer in the first and the second trench and on the first and the second metal pattern; and a third metal pattern formed on the dielectric layer, the conductive layer and the second interlayer insulating layer.

* * * * *